(12) United States Patent
Syu et al.

(10) Patent No.: US 11,641,104 B1
(45) Date of Patent: May 2, 2023

(54) ELECTROSTATIC DISCHARGE PROTECTION CIRCUIT

(71) Applicant: Winbond Electronics Corp., Taichung (TW)

(72) Inventors: Jhih-Chun Syu, Taichung (TW); Chao-Lung Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 36 days.

(21) Appl. No.: 17/519,572

(22) Filed: Nov. 5, 2021

(51) Int. Cl.
| *H02H 9/04* | (2006.01) |
| *H02H 9/02* | (2006.01) |
| *H01L 27/02* | (2006.01) |

(52) U.S. Cl.
CPC ......... *H02H 9/046* (2013.01); *H01L 27/0248* (2013.01); *H02H 9/02* (2013.01)

(58) Field of Classification Search
CPC ....... H02H 9/046; H02H 9/02; H01L 27/0248
USPC .......................................................... 361/56
See application file for complete search history.

(56) References Cited

U.S. PATENT DOCUMENTS

| 6,552,886 | B1 * | 4/2003 | Wu ..................... H01L 27/0285 361/56 |
| 6,919,602 | B2 * | 7/2005 | Lin ..................... H01L 27/0266 361/111 |
| 7,606,013 | B2 | 10/2009 | Ellis-Monaghan et al. |
| 9,488,996 | B2 * | 11/2016 | Bossu ....................... G05F 1/46 |
| 9,537,308 | B2 | 1/2017 | Truong et al. |
| 11,088,542 | B1 * | 8/2021 | Langguth ............ H01L 27/0288 |
| 2003/0039084 | A1 | 2/2003 | Hatzilambrou et al. |
| 2015/0162745 | A1 * | 6/2015 | Ikeda .................. H01L 27/0248 361/56 |
| 2015/0318275 | A1 * | 11/2015 | Chen ................... H01L 27/0285 361/56 |
| 2016/0149403 | A1 * | 5/2016 | Ikeda ..................... H02H 9/041 361/56 |
| 2019/0245341 | A1 | 8/2019 | Ma |
| 2020/0294994 | A1 * | 9/2020 | Chen ................ H03K 17/08104 |

FOREIGN PATENT DOCUMENTS

| CN | 1501757 A | * | 6/2004 |
| JP | 2004158683 | | 6/2004 |
| TW | 200739873 | | 10/2007 |

OTHER PUBLICATIONS

"Office Action of Taiwan Counterpart Application", dated Aug. 11, 2022, pp. 1-4.

\* cited by examiner

*Primary Examiner* — Dharti H Patel
(74) *Attorney, Agent, or Firm* — JCIPRNET

(57) ABSTRACT

An electrostatic discharge protection circuit, including a discharge switch, a first transistor, an inverter, and a feedback circuit, is provided. The discharge switch is coupled between a first power rail and a second power rail, and may be turned on or cut off according to a control voltage. The first transistor has a first end coupled to the first power rail. A control end of the first transistor receives the control voltage. The inverter is coupled between a second end of the first transistor and a control end of the discharge switch. The feedback circuit is coupled between an output end and an input end of the inverter and is configured to determine whether to provide a turn-on path between the input end of the inverter and the second power rail according to the control voltage.

18 Claims, 3 Drawing Sheets

ELECTROSTATIC DISCHARGE PROTECTION CIRCUIT

BACKGROUND

Technical Field

The disclosure relates to an electrostatic discharge protection circuit, and particularly relates to an electrostatic discharge protection circuit that can increase a discharge time of an electrostatic discharge current.

Description of Related Art

Please refer to FIG. 1. FIG. 1 is a circuit diagram of an electrostatic discharge circuit in the prior art. An electrostatic discharge protection circuit 100 includes a transistor T1, a resistor R1, a capacitor C1, and an inverter INV1. The transistor T1 is coupled between power rails PWL1 and PWL2, and is controlled by a control voltage Vg to be turned on or cut off.

The resistor R1 and the capacitor C1 may be configured to sense whether an electrostatic discharge phenomenon occurs on the power rail PWL1. When the electrostatic discharge phenomenon occurs, the inverter INV1 may generate a high-level control voltage Vg according to a voltage at a coupling point of the resistor R1 and the capacitor C1, so that the transistor T1 is turned on. Through the turned-on transistor T1, an electrostatic discharge current on the power rail PWL1 may be discharged to the power rail PWL2.

In the conventional electrostatic discharge protection circuit 100, a turn-on time of the transistor T1 is determined by a charging speed of the capacitor C1. To extend the discharge time of the electrostatic discharge current, it is necessary to increase the area of the capacitor C1, which will increase the area of the circuit and increase the production cost of the circuit.

SUMMARY

The disclosure provides an electrostatic discharge protection circuit, which can increase a discharge time of an electrostatic discharge current.

The electrostatic discharge protection circuit of the disclosure includes a discharge switch, a first transistor, an inverter, and a feedback circuit. The discharge switch is coupled between a first power rail and a second power rail, and is turned on or cut off according to a control voltage. The first transistor has a first end coupled to the first power rail. A control end of the first transistor receives the control voltage. The inverter is coupled between a second end of the first transistor and a control end of the discharge switch. The feedback circuit is coupled between an output end and an input end of the inverter and is configured to determine whether to provide a turn-on path between the input end of the inverter and the second power rail according to the control voltage.

Based on the above, the embodiment of the disclosure executes an electrostatic discharge phenomenon on the first power rail through the first transistor and the feedback circuit. The first transistor is configured to provide an active load. The feedback circuit is configured to extend the discharge time of the electrostatic discharge current in an electrostatic discharge protection mode. The feedback circuit is configured to keep the discharge switch from being turned on in a normal working mode. Through the architecture of the electrostatic discharge protection circuit of the embodiment of the disclosure, the area of the circuit can be effectively reduced.

DETAILED DESCRIPTION OF DISCLOSED EMBODIMENTS

Figure 2:
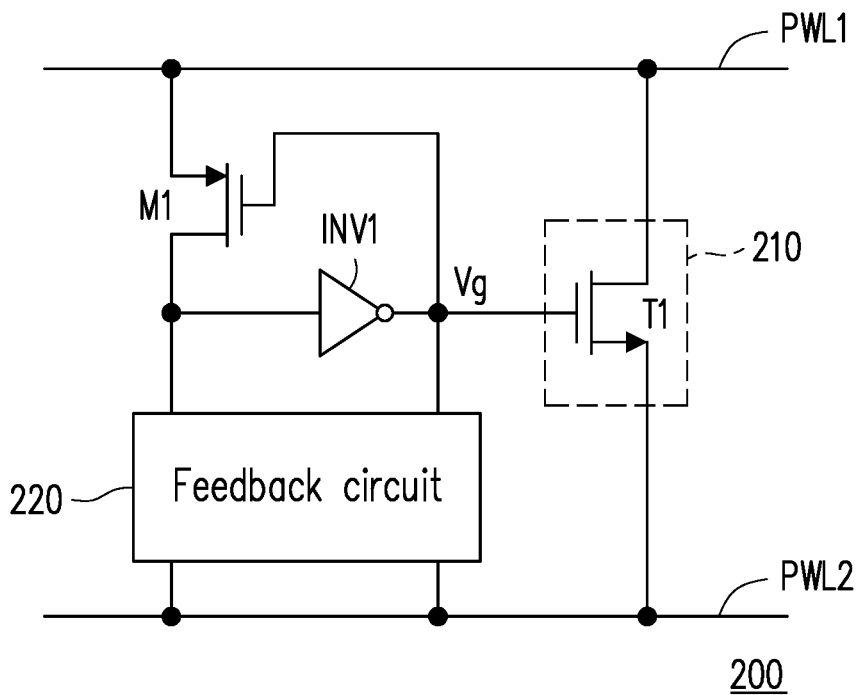
FIG. 2 is a schematic diagram of an electrostatic discharge protection circuit according to an embodiment of the disclosure.

Please refer to FIG. 2. FIG. 2 is a schematic diagram of an electrostatic discharge protection circuit according to an embodiment of the disclosure. An electrostatic discharge protection circuit 200 includes a discharge switch 210, a transistor M1, an inverter INV1, and a feedback circuit 220. The discharge switch 210 is coupled between a power rail PWL1 and a power rail PWL2. The discharge switch 210 may be constructed by a transistor T1. A control end of the transistor T1 receives a control voltage Vg and may be turned on or cut off according to the control voltage Vg.

In the embodiment, in a normal working mode, the power rail PWL1 may be configured to receive an operating power supply, and the power rail PWL2 may be configured to receive a ground voltage.

In addition, a first end of the transistor M1 is coupled to the power rail PWL1, and a second end of the transistor M1 is coupled to the feedback circuit 220 and an input end of the inverter INV1. A control end of the transistor M1 is coupled to an output end of the inverter INV1 to receive the control voltage Vg. On the other hand, the feedback circuit 220 is coupled to the input end and the output end of the inverter INV1. The feedback circuit 220 is configured to determine whether to provide a turn-on path between the input end of the inverter INV1 and the power rail PWL2 according to the control voltage Vg.

In terms of action details, the transistor M1 and the feedback circuit 220 are configured to sense whether an electrostatic discharge phenomenon occurs on the power rail PWL1. The transistor M1 may be used as an active load, and when the electrostatic discharge phenomenon occurs, the transistor M1 may be cut off and provide a relatively high resistance value. At this time, the voltage at the input end of the inverter INV1 may be a relatively low ground voltage, and the inverter INV1 generates a relatively high control voltage Vg at the output end. The feedback circuit 220 provides the turn-on path on the power rail PWL2 and at the input end of the inverter INV1 according to the control voltage Vg with the relatively high voltage and keeps the input end of the inverter INV1 equal to the ground voltage.

At the same time, the discharge switch 210 composed of the transistor T1 may be turned on according to the control voltage Vg and form a current discharge path of an electrostatic discharge current between the power rails PWL1 and PWL2 to achieve the ability of electrostatic discharge protection.

Please note here that in an electrostatic discharge mode, the feedback circuit 220 of the embodiment of the disclosure may effectively extend a turn-on time of the discharge switch 210 and increase a discharge time of the electrostatic discharge current through providing a turn-on path between the input end of the inverter INV1 and the power rail PWL2 and keeping the inverter INV1 equal to the ground voltage.

On the other hand, when the electrostatic discharge phenomenon does not occur, the transistor M1 may be turned on and provide a relatively low resistance value. In the normal working mode, the input end of the inverter INV1 is substantially equal to the operating power supply, and the inverter INV1 generates the control voltage Vg with a relatively low voltage (for example, equal to the ground voltage) at the output end thereof, and the transistor T1 in the discharge switch 210 is cut off. At this time, the feedback circuit 220 may cut off connection path between the power rail PWL2 and the input end of the inverter INV1 according to, for example, the control voltage Vg equal to the ground voltage.

Figure 3:
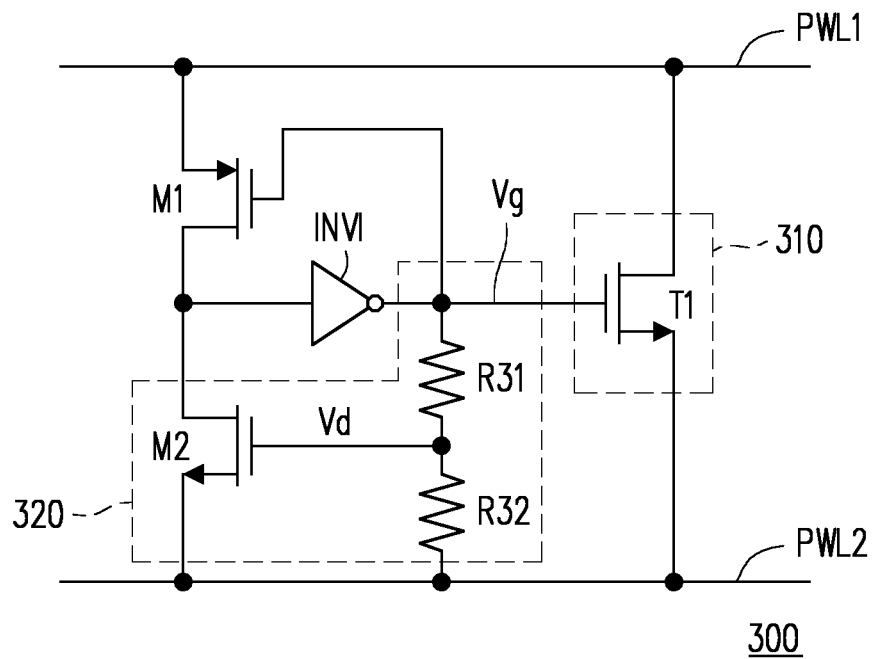
FIG. 3 is a schematic diagram of an electrostatic discharge protection circuit according to another embodiment of the disclosure.

Please refer to FIG. 3 below. FIG. 3 is a schematic diagram of an electrostatic discharge protection circuit according to another embodiment of the disclosure. An electrostatic discharge protection circuit 300 includes a discharge switch 310, a transistor M1, an inverter INV1, and a feedback circuit 320. The discharge switch 310 is constructed by the transistor T1. A control end of the transistor T1 receives the control voltage Vg and may be turned on or cut off according to the control voltage Vg. The feedback circuit 320 includes a voltage divider composed of resistors R31 and R32 and a transistor M2. The voltage divider composed of the resistors R31 and R32 is connected in series between the output end of the inverter INV1 and the power rail PWL2. The resistors R31 and R32 are configured to divide the control voltage Vg at the output end of the inverter INV1 and generate a divided voltage Vd. A first end of the transistor M2 is coupled to the second end of the transistor M1, a second end of the transistor M2 is coupled to the power rail PWL2, and a control end of the transistor M2 is coupled to the resistors R31 and R32, and receives the divided voltage Vd.

In the embodiment, in the normal working mode, the power rail PWL1 may be configured to receive the operating power supply, and the power rail PWL2 may be configured to receive the ground voltage.

Figure 1:
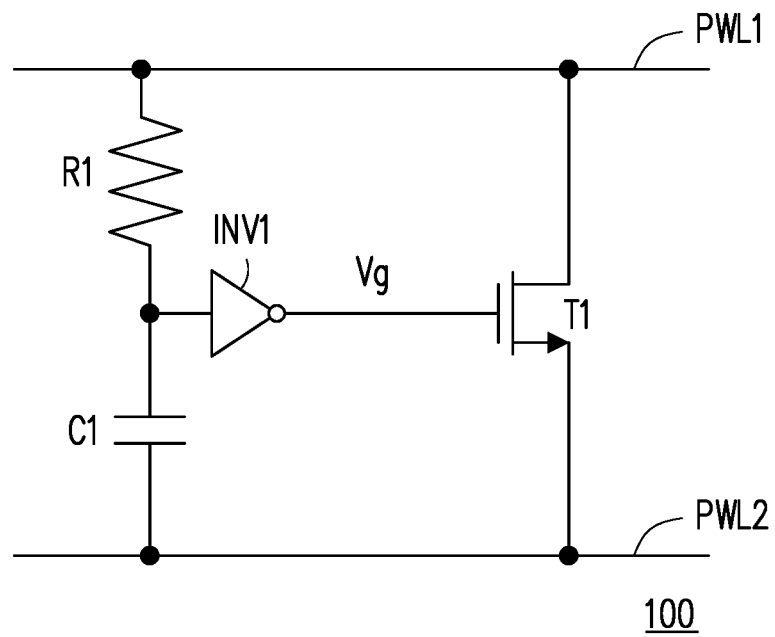
FIG. 1 is a circuit diagram of an electrostatic discharge circuit in the prior art.

Compared with the electrostatic discharge protection circuit 100 of the prior art in FIG. 1, the electrostatic discharge protection circuit 300 of the embodiment uses the transistor M1 as the active load and replaces the resistor R1 to provide different resistance values in different modes. The feedback circuit 320 is configured to replace the capacitor C1 and may extend the length of time that the transistor T1 is turned on and the discharge time of the electrostatic discharge current under the condition of occupying a smaller layout area. Accordingly, the electrostatic discharge protection circuit 300 of the disclosure can not only reduce the cost of the circuit, but also effectively improve the efficiency of electrostatic discharge protection, so as to have multiple advantages.

Figure 4A:
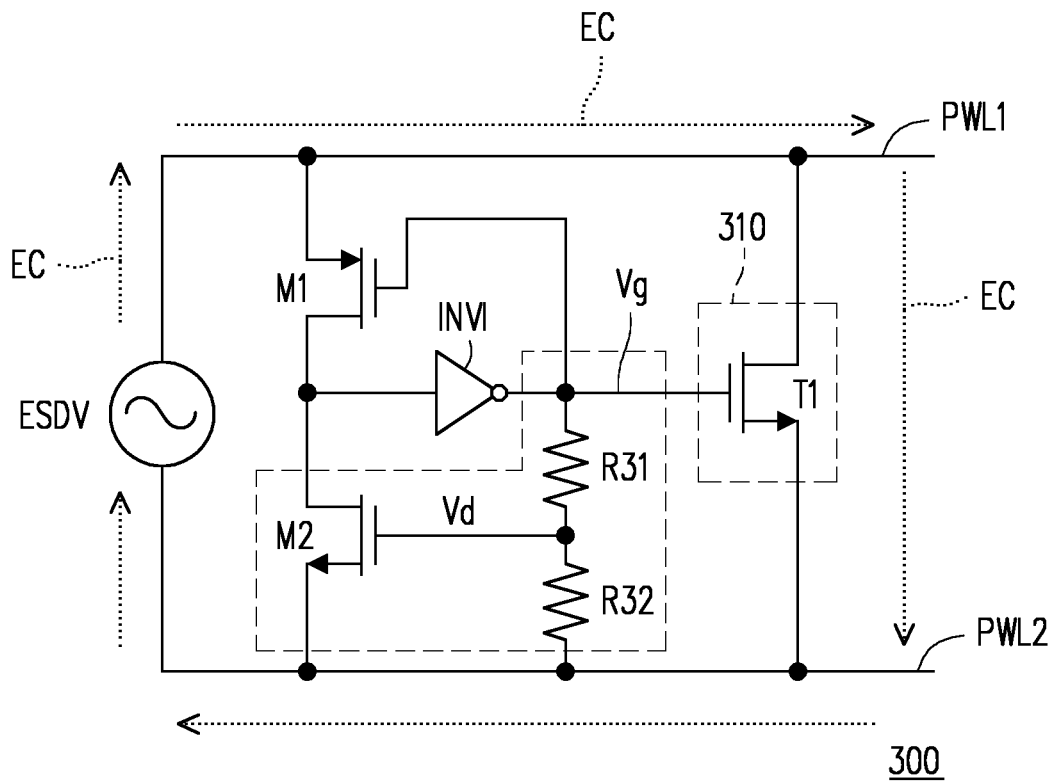
FIG. 4A and FIG. 4B are schematic diagrams of equivalent circuits of the electrostatic discharge protection circuit in action according to the embodiment of the disclosure.
Figure 4B:
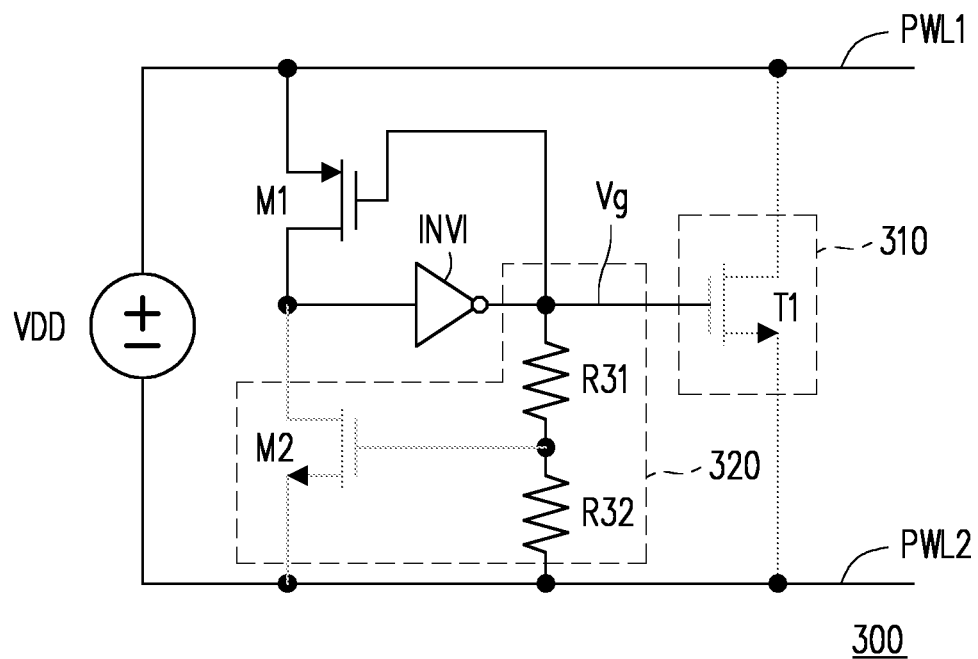

In terms of action details, reference may be made to schematic diagrams of equivalent circuits of the electrostatic discharge protection circuit in action according to the embodiment of the disclosure in FIG. 4A and FIG. 4B. In FIG. 4A, the electrostatic discharge protection circuit 300 works in an electrostatic discharge protection mode. An electrostatic discharge voltage ESDV with positive pulse wave is applied onto the power rail PWL1. At this time, the transistor M1 is cut off and provides a relatively high resistance value. The inverter INV1 generates the control voltage Vg with a relatively high second voltage at the output end thereof according to a relatively low first voltage at the input end thereof. The control voltage Vg is provided to the control end of the transistor T1 of the discharge switch 310, so that the transistor T1 is turned on. The turned-on transistor T1 may provide a discharge path of an electrostatic discharge current EC and achieve the objective of protection.

At the same time, the voltage divider formed by the resistors R31 and R32 divides the voltage according to the control voltage Vg and generates the divided voltage Vd. The divided voltage Vd may be provided to the control end of the transistor M2, so that the transistor M2 is turned on. Here, the turned-on transistor M2 may provide a turn-on path between the input end of the inverter INV1 and the power rail PWL2, so that the input end of the inverter INV1 may be kept equal to the ground voltage.

By the way, the state of the feedback circuit 320 keeping the input end of the inverter INV1 equal to the ground voltage may be released after the electrostatic discharge voltage ESDV drops to a specific voltage level.

In the embodiment, the resistance value of the resistor R31 may be less than the resistance value of the resistor R32. A channel width-to-length ratio of the transistor M1 may be less than a channel width-to-length ratio of the transistor M2. Also, the channel width-to-length ratios of the transistors M1 and M2 are both less than 1.

In FIG. 4B, the electrostatic discharge protection circuit 300 works in a normal working mode. An operating power supply VDD is applied onto the power rail PWL1, and the power rail PWL2 receives the ground voltage. At this time, the transistor M1 is turned on and provides a relatively low resistance value. The voltage at the input end of the inverter INV1 is pulled up to the second voltage (equal to the operating power supply VDD), and the output end of the inverter INV1 generates the control voltage Vg that is the first voltage (equal to the ground voltage).

The control voltage Vg is provided to the control end of the transistor T1, so that the transistor T1 is cut off. In this way, the power rails PWL1 and PWL2 are not turned on relative to each other, and the subsequent circuit may keep normal operation.

Figure 5:
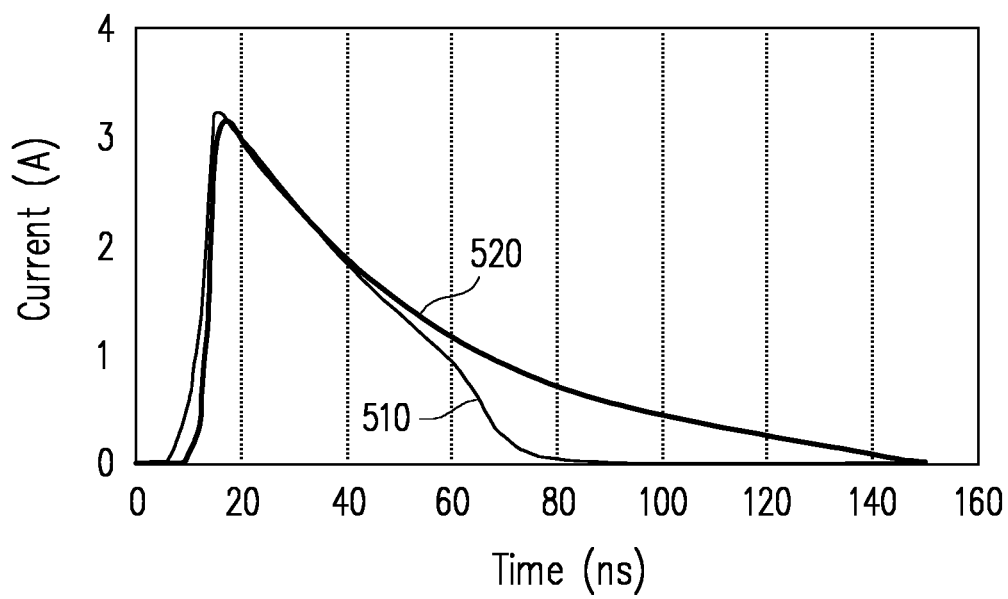
FIG. 5 is a current waveform diagram of the electrostatic discharge protection circuit according to an embodiment of the disclosure and the conventional electrostatic discharge circuit in an electrostatic discharge mode.

Please refer to FIG. 5. FIG. 5 is a current waveform diagram of the electrostatic discharge protection circuit according to an embodiment of the disclosure and the conventional electrostatic discharge circuit in the electrostatic discharge mode. The horizontal axis in FIG. 5 is time in units of nanoseconds (ns). The vertical axis is current in unit of ampere (A). A curve 520 is, for example, the current waveform curve of the electrostatic discharge protection circuit 300 of the embodiment of the disclosure when executing an electrostatic discharge action. A curve 510 is the current waveform curve of the conventional electrostatic discharge protection circuit 100 when executing an electrostatic discharge action. Obviously, the discharge time of the electrostatic discharge current that may be provided by the electrostatic discharge protection circuit 300 of the embodiment of the disclosure is significantly longer than the discharge time of the electrostatic discharge current provided by the conventional electrostatic discharge protection circuit 100. Therefore, the electrostatic discharge energy that may be discharged by the electrostatic discharge protection circuit 300 of the embodiment of the disclosure is far greater than the electrostatic discharge energy that may be discharged by the conventional electrostatic discharge protection circuit 100. It can be known that the electrostatic discharge protection level that may be achieved by the electrostatic discharge protection circuit 300 of the embodiment of the disclosure can be further improved.

It is worth mentioning that the electrostatic discharge protection circuit 300 of the embodiment of the disclosure may have a lower leakage current than the conventional electrostatic discharge protection circuit 100 in the normal working mode. Since the conventional electrostatic discharge protection circuit 100 has the resistor R1 and the capacitor C1 connected in series between the power rails PWL1 and PWL2, a relatively large leakage current is generated. In the electrostatic discharge protection circuit 300 of the embodiment of the disclosure, there is no voltage difference between two ends of the voltage divider (the resistors R31 and R32) in the normal working mode, and in the case where the transistors M2 and T1 are both cut off, the generated leakage current can be reduced.

In summary, the electrostatic discharge protection circuit of the disclosure can extend the discharge time of the electrostatic discharge current and greatly increase the ability of electrostatic discharge protection under the premise of reducing the layout area of the circuit through the cooperation of the feedback circuit and the transistor.

What is claimed is:

1. An electrostatic discharge protection circuit, comprising:
   a discharge switch, coupled between a first power rail and a second power rail, and turned on or cut off according to a control voltage;
   a first transistor, having a first end coupled to the first power rail, and a control end of the first transistor receiving the control voltage;
   an inverter, coupled between a second end of the first transistor and a control end of the discharge switch; and
   a feedback circuit, coupled between an output end and an input end of the inverter and configured to determine whether to provide a turn-on path between the input end of the inverter and the second power rail according to the control voltage.

2. The electrostatic discharge protection circuit according to claim 1, wherein the feedback circuit comprises:
   a voltage divider, coupled between the output end of the inverter and the second power rail, and configured to divide the control voltage to generate a divided voltage; and
   a second transistor, having a first end coupled to the input end of the inverter, a second end of the second transistor being coupled to the second power rail, and a control end of the second transistor receiving the divided voltage.

3. The electrostatic discharge protection circuit according to claim 2, wherein channel width-to-length ratios of the first transistor and the second transistor are both less than 1.

4. The electrostatic discharge protection circuit according to claim 2, wherein a channel width-to-length ratio of the first transistor is less than a channel width-to-length ratio of the second transistor.

5. The electrostatic discharge protection circuit according to claim 2, wherein the voltage divider comprises:
   a first resistor, having a first end coupled to the output end of the inverter; and
   a second resistor, coupled in series between a second end of the first resistor and the second power rail.

6. The electrostatic discharge protection circuit according to claim 5, wherein a resistance value of the first resistor is less than a resistance value of the second resistor.

7. The electrostatic discharge protection circuit according to claim 2, wherein the first transistor is a p-type transistor and the second transistor is an n-type transistor.

8. The electrostatic discharge protection circuit according to claim 1, wherein in an electrostatic protection mode, the first transistor is cut off, the feedback circuit provides the turn-on path between the input end of the inverter and the second power rail, and the inverter generates the control voltage equal to a second voltage according to a first voltage on the second power rail, so that the discharge switch is turned on according to the control voltage.

9. The electrostatic discharge protection circuit according to claim 8, wherein the first voltage is less than the second voltage.

10. The electrostatic discharge protection circuit according to claim 1, wherein in a normal working mode, the first transistor is turned on, the feedback circuit cuts off the turn-on path between the input end of the inverter and the second power rail, and the inverter generates the control voltage equal to a first voltage according to a second voltage on the first power rail, so that the discharge switch is cut off according to the control voltage.

11. The electrostatic discharge protection circuit according to claim 10, wherein the first voltage is less than the second voltage.

12. The electrostatic discharge protection circuit according to claim 1, wherein the discharge switch is a transistor switch.

13. The electrostatic discharge protection circuit according to claim 12, wherein the transistor switch comprises:
   a second transistor, wherein a first end of the second transistor is coupled to a first power rail, a second end of the second transistor is coupled to the second power rail and a control end of the second transistor receives the control voltage.

14. The electrostatic discharge protection circuit according to claim 2, wherein the transistor switch forms a current discharge path of an electrostatic discharge current between the first power rail and the second power rail in an electrostatic protection mode.

15. The electrostatic discharge protection circuit according to claim 14, wherein when the transistor switch is turned on in an electrostatic discharge mode, the voltage divider provides the divided voltage to the control end of the second transistor to turn on the second transistor.

16. The electrostatic discharge protection circuit according to claim 15, wherein when the second transistor in turned on, the input end of the inverter is kept equal to a ground voltage.

17. The electrostatic discharge protection circuit according to claim 16, wherein a state of the input end of the inverter keeping equal to a ground voltage is released after an electrostatic discharge voltage drops to a specific voltage level.

18. The electrostatic discharge protection circuit according to claim 1, wherein the first power rail receives an operation power supply, and the second power rail receives a ground voltage during a normal working mode.

* * * * *